(12) United States Patent
Yoshi et al.

(10) Patent No.: US 9,420,698 B2
(45) Date of Patent: Aug. 16, 2016

(54) CONDUCTIVE SUBSTRATE COMPRISING A METAL FINE PARTICLE SINTERED FILM

(75) Inventors: Naonobu Yoshi, Ibaraki (JP); Mikiko Hojo, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 1028 days.

(21) Appl. No.: 13/202,425

(22) PCT Filed: Feb. 19, 2010

(86) PCT No.: PCT/JP2010/052563
§ 371 (c)(1),
(2), (4) Date: Nov. 1, 2011

(87) PCT Pub. No.: WO2010/095723
PCT Pub. Date: Aug. 26, 2010

(65) Prior Publication Data
US 2012/0061130 A1    Mar. 15, 2012

(30) Foreign Application Priority Data
Feb. 20, 2009 (JP) .................... 2009-038272

(51) Int. Cl.
*H05K 1/09* (2006.01)
*H05K 3/12* (2006.01)
*H05K 1/03* (2006.01)

(52) U.S. Cl.
CPC ............ *H05K 3/1283* (2013.01); *H05K 1/0393* (2013.01); *H05K 2203/1131* (2013.01)

(58) Field of Classification Search
CPC .............. H05K 3/1283; H05K 1/0393; H05K 2203/1131
USPC .......................... 174/257, 250, 253, 255, 256
See application file for complete search history.

(56) References Cited

U.S. PATENT DOCUMENTS 6,864,415 B2 * 3/2005 Koyanagi et al. ............. 136/256
2002/0183536 A1   12/2002 Aramata et al.
(Continued)

FOREIGN PATENT DOCUMENTS

CN     1431167 (A)    7/2003
CN     1179920 C      12/2004
(Continued)

OTHER PUBLICATIONS

JP Official Action dated Mar. 5, 2013, for JP Application No. 2009-038272.
(Continued)

*Primary Examiner* — Tremesha S Willis
(74) *Attorney, Agent, or Firm* — Ladas & Parry LLP

(57) ABSTRACT

Provided is a conductive substrate which is prepared by forming a pattern-shaped metal fine particle sintered film such as a copper wiring and the like on a base material of polyimide and the like and which has a high adhesive property with the base material and is provided with an excellent conductivity. The conductive substrate of the present invention is prepared by printing a coating liquid containing metal or metal oxide fine particles on a base material to form a print layer and subjecting the above print layer to sintering treatment to form a metal fine particle sintered film, wherein a crystallite diameter in the metal fine particle sintered film which is measured by X ray diffraction is 25 nm or more, and a cross section of the metal fine particle sintered film has a void rate of 1% or less.

20 Claims, 3 Drawing Sheets

(56) References Cited

U.S. PATENT DOCUMENTS

| | | | |
|---|---|---|---|
| 2003/0096059 A1* | 5/2003 | Suzuki et al. | 427/282 |
| 2005/0082662 A1* | 4/2005 | Nakamura et al. | 257/703 |
| 2006/0194032 A1 | 8/2006 | Furuse et al. | |
| 2008/0073000 A1* | 3/2008 | Ikeda et al. | 148/24 |
| 2008/0096033 A1* | 4/2008 | Shinohara | C08G 18/289 428/500 |
| 2008/0257746 A1 | 10/2008 | Ono et al. | |
| 2009/0035592 A1* | 2/2009 | Shirakawa et al. | 428/471 |
| 2010/0059719 A1* | 3/2010 | Ohno | 252/511 |
| 2010/0147577 A1* | 6/2010 | Tanaka et al. | 174/350 |

FOREIGN PATENT DOCUMENTS

| | | |
|---|---|---|
| CN | 1179920 (C) | 12/2004 |
| JP | 5-102656 | 4/1993 |
| JP | 9-237957 | 9/1997 |
| JP | 2001-089803 | 4/2001 |
| JP | 2002-232142 | 8/2002 |
| JP | 2002-301371 | 10/2002 |
| JP | 2003-124589 | 4/2003 |
| JP | 2003-282565 | 10/2003 |
| JP | 2005-45236 | 2/2005 |
| JP | 2005-131851 | 5/2005 |
| JP | 2006-269557 | 10/2006 |
| JP | 2006-307254 | 11/2006 |
| JP | 2007-150143 | 6/2007 |
| JP | 2007-182623 | 7/2007 |
| JP | 2008-031491 | 2/2008 |
| JP | 2008-166017 | 7/2008 |
| JP | 2008-200875 | 9/2008 |
| JP | 2008-243946 | 10/2008 |

OTHER PUBLICATIONS

Chinese Official Action dated Dec. 2, 2013, for CN Application No. 201080008731.0.

* cited by examiner

US 9,420,698 B2

CONDUCTIVE SUBSTRATE COMPRISING A METAL FINE PARTICLE SINTERED FILM

BACKGROUND OF THE INVENTION

The present invention relates to a conductive substrate, more specifically to a conductive substrate obtained by printing a coating liquid containing metal or metal oxide fine particles on a base material to form a print layer and subjecting the above print layer to sintering treatment to form a metal fine particle sintered film and a method for producing the above conductive substrate.

RELATED ART

A substrate prepared by forming circuit patterns on a base material formed by a polyimide resin has so far been used as a flexible printed wiring board. A method in which a photoresist and the like are coated on a base material comprising a meal foil stuck thereon and exposed to light through a desired circuit pattern to form patterns by chemical etching has so far been used as a method for forming the above circuit patterns.

In the above method, the volume resistivity is small since a metal foil can be used as a conductive wiring, and a conductive substrate having a high performance can be produced, but the above method using such lithographic technology involves the defects that steps are large in number and complicated and that a photoresist material is required. Further, when circuits are formed by copper directly on a base material of polyimide and the like, it is difficult to adhere the circuits on the base material, and a method in which a layer for providing an adhesive property is formed in an interface between a base material and circuits and a method in which an adhesion surface is roughened to enhance an adhesive property have so far been employed. However, the problem that the conductivity and the insulation property are reduced has been involved in forming the adhesive layer, and the problem that the conductivity is reduced by irregularities on the adhesion surface has been involved in the method in which the adhesion surface is roughened.

In contrast with this, proposed is a technique in which an alkaline aqueous solution is coated on a polyimide resin to cleave an imide ring of the polyimide resin to thereby form a carboxyl group and in which a metal salt thereof is formed by bringing the above carboxyl group into contact with a metal ion-containing solution to obtain a metal thin film by reduction reaction (refer to claims of a patent document 1). The metal stays in a situation in which it is buried in a surface layer part of the polyimide resin, and the thin film having a high adhesive property is obtained by an anchor locking effect (refer to a paragraph 0049 of the patent document 1).

In the above method, however, involved is the problem that the wirings are short-circuited due to migration of copper on the polyimide or the problem that the electrical reliability is reduced due to large irregularities on the interface.

Further, proposed is a laminate which comprises an insulating resin layer formed on an insulating substrate and a metal thin film layer formed on the insulating resin layer and in which metal oxide is present in a contact interface between the insulating resin layer and the metal thin film layer (refer to claims of a patent document 2). According to the patent document 2, it is suggested that the metal oxide increases an adhesive strength of the insulating resin layer with the metal thin film layer (refer to a paragraph 0020 of the patent document 2).

However, in the laminate disclosed in the patent document 2, the metal oxide layer, particularly a layer of copper oxide is weak to a strong acid, and it is anticipated that the metal oxide layer is molten when increasing a thickness of the wirings by an electrolytic copper plating method and that the adhesive property is reduced.

Patent document 1: Japanese Patent Application Laid-Open No. 45236/2005
Patent document 2: Japanese Patent Application Laid-Open No. 200875/2008

BRIEF EXPLANATIONS OF THE DRAWINGS

DISCLOSURE OF THE INVENTION

Figure 1:
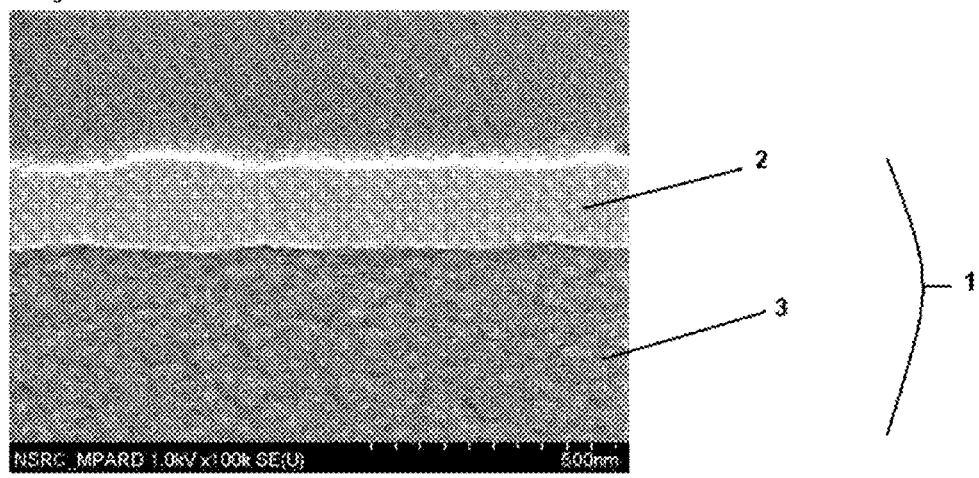
FIG. 1 is a scanning electron micrograph of a cross section of the conductive substrate of the present invention according to Example 1.

The present invention has been made under the situation described above, and an object of the present invention is to provide a conductive substrate which is prepared by forming a metal fine particle sintered film such as a copper wiring and the like on a base material of polyimide and the like and which has a high adhesive property of the metal fine particle sintered film with the base material and is provided with an excellent conductivity and a method for producing the above conductive substrate.

Intensive investigations repeated by the present inventors in order to achieve the object described above have resulted in finding that a metal thin film can be formed directly on a base material by using a technique in which fine particles of metal and the like are printed on the base material and in which the particles are sintered to form a thin film. On the other hand, involved therein is the problem that even if the above technique is used, an adhesive property of an interface between the base material and the metal thin film is reduced, and it has been found that the cause thereof is attributable to the fact that the particles grow due to aggregation of the particles at the same time as sintering to bring about voids in an interface between the particles and the base material. Further investigations on the fact that the voids are brought about have resulted in finding that a structure in which voids are not brought about in the film and an interface of the base material is formed by sintering the particles for short time before the particles grow due to aggregation of the particles to increase a crystallite diameter obtained from a result of X ray diffraction to 25 nm or more and that an interface between the base material and the metal thin film is smooth and provided with a high adhesive property. Further, it has been found that the higher adhesive property is obtained if organic substances and the like are not present in the metal thin film. The present invention has been completed based on the above knowledge.

That is, the present invention provides a conductive substrate prepared by printing a coating liquid containing metal or metal oxide fine particles on a base material to form a print layer and subjecting the above print layer to sintering treatment to form a metal fine particle sintered film, wherein a crystallite diameter in the metal fine particle sintered film described above which is measured by X ray diffraction is 25 nm or more, and a cross section of the metal fine particle sintered film has a void rate of 1% or less.

According to the present invention, capable of being provided is a conductive substrate which is prepared by forming a pattern-shaped metal fine particle sintered film such as a copper wiring and the like on a base material of polyimide and the like and which has a high adhesive property with the base material and is provided with an excellent conductivity.

BEST MODE FOR CARRYING OUT THE INVENTION

The conductive substrate of the present invention is prepared by printing a coating liquid containing metal or metal oxide fine particles on a base material to form a print layer and subjecting the above print layer to sintering treatment to form a metal fine particle sintered film.

Base Material:

The base material used in the present invention shall not specifically be restricted as long as it is used for a conductive substrate, and capable of being used are, for example, inorganic materials including glass substrates such as soda lime glass, non-alkali glass, silicate glass, high distortion point glass, quartz glass and the like and ceramic substrates such as alumina, silica and the like. Further, high polymer materials, papers and the like can be used as well.

Further, in the present invention, metal or metal oxide fine particles are, as described later in detail, sintered at low temperature for short time, and a conductive thin film is formed, so that the base material is less damaged. Specific glass having a high heat resistance such as high distortion point glass and the like is not required to be used, and usual soda lime glass and the like having a low heat resistance can be used as well. Further, high polymer materials such as plastics and the like can be used as well for the base material, and they are particularly useful since resin films such as polyimide can be used.

Various materials can be listed according to uses as the high polymer materials which can be used as the base material. Materials having a melting point of 200° C. or higher are preferred, and capable of being used are, for example, polyethylene terephthalate, polyethylene naphthalate, polycarbonate, polyimide, polyamide, polyamideimide, polyethersulfone, polyetherimide, epoxy resins, glass-epoxy resins, polyphenylene ether and the like. Among them, the polyimide resins are preferred in terms of a heat resistance, a mechanical strength, an electrical insulating property, a chemical resistance and the like.

In the conductive substrate of the present invention, the reason why an adhesive property of the metal fine particle sintered film with the polyimide base material is good as well is not certain, and it is considered that the metal fine particle sintered film having a specific structure as is the case with the present invention has chemical interaction such as ion bonding in an interface with a strongly polar functional group such as a carboxyl group which is slightly present on a surface of polyimide.

A thickness of the base material shall not specifically be restricted, and when the base material is an inorganic material, a thickness thereof is usually 0.1 to 10 mm, preferably 0.5 to 5 mm.

On the other hand, when the base material is a plastic substrate, a thickness thereof falls usually in a range of 10 to 300 μm. If it is 10 μm or more, the base material is inhibited from being deformed when the conductive layer is formed, and it is suited in terms of a shape stability of the conductive layer formed. Also, if it is 300 μm or less, it is suited in terms of a flexibility when winding processing is continuously carried out.

Metal or Metal Oxide Fine Particles:

The kind of the metal shall not specifically be restricted as long as it has a conductivity and includes noble metals such as gold, silver, platinum, palladium, rhodium, iridium, ruthenium, osmium and the like; and base metals such as copper, nickel, tin, iron, chromium and the like.

Among them, gold, silver, copper and nickel are preferred from the viewpoint that they have a high conductivity and can readily maintain the fine particles, and taking a conductivity, an economical efficiency, a migration resistance and the like into consideration, copper is preferred.

The above metals may be used alone or in a mixture or an alloy of two or more kinds thereof. Further, the metal oxide includes suitably silver oxide, cuprous oxide, cupric oxide and mixtures thereof. Among them, the compounds of copper are particularly preferred, and above all, the oxides of copper (cuprous oxide, cupric oxide and mixtures thereof) are suited.

In this connection, an embodiment in which a surface of the metals is oxidized is included as well in the metal oxides, and copper having an oxidized surface is preferred in the present invention.

A method for preparing the metal fine particles and the metal oxide fine particles each described above includes various methods, and they can be prepared by a physical method in which they are obtained by crushing metal powders by a mechanochemical method and the like; a chemical dry method such as a CVD method, a vapor deposition method, a sputtering method, a hot plasma method, a laser method and the like; methods called a chemical wet method such as a thermal decomposition method, a chemical reduction method, an electrolytic method, a supersonic method, a laser ablation method, a supercritical fluid method, a microwave synthetic method and the like.

In order to turn the fine particles obtained into a dispersion, they are coated preferably with water-soluble high polymers such as polyvinyl pyrrolidone and the like, protecting agents such as graft high copolymers and the like, surfactants and compounds having a thiol group, an amino group, a hydroxyl group and a carboxyl group which are interacted with metals. Also, depending on the synthetic methods, the thermally decomposed products and the metal oxides of the raw materials protect the surfaces of the particles and contribute to the dispersibility in a certain case. When the fine particles are produced by the chemical wet method such as the thermal decomposition method, the chemical reduction method and the like, the reducing agent and the like act as a protecting agent for the fine particles as they are in a certain case.

Further, in order to enhance a dispersion stability of the dispersion, the fine particles may be subjected to surface treatment, and a dispersant comprising a high polymer, an ionic compound, a surfactant and the like may be added thereto.

An average primary particle diameter of the fine particles described above falls preferably in a range of 1 to 200 nm. If the average primary particle diameter is 1 nm or more, a dispersion stability of the dispersion is good, and when the conductive thin film is formed, a conductivity thereof is kept good. On the other hand, if the average primary particle diameter is 200 nm or less, the melting point is kept low, and the particles can sufficiently be sintered, so that the high conductivity is obtained. From the above viewpoints, an average primary particle diameter of the fine particles falls in a range of preferably 1 to 100 nm, more preferably 1 to 70 nm and particularly preferably 2 to 50 nm. In this connection, an average primary particle diameter of the fine particles in the dispersion is measured from images observed under a transmission electron microscope.

The above fine particles may be either fine particles comprising single crystal or polycrystalline fine particles obtained by allowing a plurality of smaller crystallites to be put together.

Water and/or an organic solvent can be used as a dispersion medium constituting a liquid dispersion (coating liquid) of the fine particles to disperse the fine particles described above. The organic solvent includes alcohols such as methanol, ethanol, n-propanol, isopropanol, n-butanol, ethylene glycol, diethylene glycol, triethylene glycol, propylene glycol, glycerin and the like; aromatic hydrocarbons such as toluene, xylene and the like; ketones such as acetone, methyl ethyl ketone, methyl isobutyl ketone and the like; esters such as methyl acetate, ethyl acetate, propyl acetate, butyl acetate, isobutyl acetate and the like; ethers such as tetrahydrofuran, dioxane, ethylene glycol monomethyl ether (methyl cellosolve), ethylene glycol monoethyl ether (ethyl cellosolve), ethylene glycol monobutyl ether (butyl cellosolve) and the like; aliphatic hydrocarbons such as hexane, decane, dodecane, tetradecane and the like; alicyclic hydrocarbons such as cyclohexane and the like.

Further, for the purposes of enhancing a film forming property, providing a printing aptitude and enhancing a dispersibility, a polyester resin, an acryl resin, a urethane resin or the like may be added as a resin binder to the dispersion. Also, a viscosity controlling agent, a surface tension controlling agent, a stabilizing agent and the like may be added if necessary.

A solid matter concentration of the fine particle dispersion of the present invention falls preferably in a range of 5 to 60% by mass. If the solid matter concentration is 5% by mass or more, the satisfactory conductivity is obtained. If it is 60% by mass or less, the viscosity is sufficiently low, and the fine particle dispersion is readily printed on the base material. From the above viewpoints, a solid matter concentration of the fine particle dispersion falls more preferably in a range of 10 to 50% by mass.

A method for printing the fine particle dispersion on the base material shall not specifically be restricted, and capable of being used are methods such as gravure printing, screen printing, spray coating, spin coating, comma coating, bar coating, knife coating, offset printing, flexographic printing, ink jet printing, dispenser printing and the like. Among them, gravure printing, flexographic printing, screen printing and ink jet printing are preferred from the viewpoint that fine patterning can be carried out.

Further, the fine particle dispersion can be printed directly on the base material in a desired pattern in the present invention, and therefore the productivity can notably be enhanced as compared with conventional methods using a photoresist.

The fine particle dispersion on the base material may be dried by an ordinary method after printed. To be specific, it is dried at a temperature of 80 to 140° C. for 0.1 to 20 minutes by means of an ordinary oven and the like. A film thickness of the printed part after dried can be controlled by changing suitably a coating amount and an average primary particle diameter of the fine particles according to the uses, and it falls in a range of usually 0.01 to 100 µm, preferably 0.1 to 50 µm.

Sintering Treatment:

Next, the sintering in the present invention shall not specifically be restricted as long as it is a method by which metal or metal compound fine particles can be fused to form a conductive thin film, and it may be carried out, for example, in a sintering oven or may be carried out by using a plasma, a heating catalyst, a UV ray, a vacuum UV ray, an electron beam, an infrared lamp anneal, a flash lamp anneal, a laser and the like. The above sintering is carried out preferably under inert gas atmosphere or reducing gas atmosphere from the viewpoint of a conductivity of the metal fine particle sintered film.

The above sintering treatment is carried out preferably for short time at a heating rate of 100° C./minute or more, preferably 200° C./minute or more. Time spent for the sintering reaction is 5 minutes or shorter, preferably 2 minutes or shorter, and the particles can be inhibited from growing.

Also, when the metal fine particles contain base metals or oxides, a method in which active species having a reducing property are generated is preferred. Further, when the base material is a resin or a low heat resistant base material, a method in which the fine particles are heated from a surface layer of the coated layer is preferably used in order to prevent the base material from being damaged by heat.

Among the sintering methods described above, particularly sintering treatment carried out by a surface wave plasma (hereinafter referred to as a microwave surface wave plasma) generated by applying a microwave energy exerts less thermal damage on the base material and makes it possible to carry out the sintering treatment in a large area for short time.

In the present invention, the fine particles are preferably subjected to sintering treatment by exposing them to a microwave surface wave plasma to form a conductive layer comprising a metal fine particle sintered film, particularly a pattern-shaped metal fine particle sintered film.

Heating is preferably carried out at a temperature of 200 to 500° C. for 10 minutes to 2 hours under the air or atmosphere containing oxygen before the treatment carried out by the surface wave plasma in order to remove organic matters such as the dispersant and the like contained in the printed layer prepared by printing the coating liquid containing the metal or metal oxide fine particles. The organic matters are removed by oxidation and decomposition by the above heating.

<Method for Generating Surface Wave Plasma>

A method for generating the surface wave plasma described above shall not specifically be restricted, and capable of being used is, for example, an electrodeless plasma generating means in which a microwave energy is supplied from an irradiation window of a sintering treatment chamber staying in a vacuum state to generate a surface wave plasma along the irradiation window in the above sintering treatment chamber.

In the plasma generating means described above, a microwave energy having a frequency of 2450 MHz is supplied from the irradiation window of the sintering treatment chamber, whereby a microwave surface wave plasma having an electron temperature of 1 eV or less and an electron density of about $1 \times 10^{11}$ to $1 \times 10^{13}$ cm$^{-3}$ can be generated.

In general, a microwave energy is an electromagnetic wave having a frequency of 300 MHz to 3000 GHz, and an electromagnetic wave having a frequency of, for example, 2450 MHz is used. In this case, a frequency range of 2450 MHz±50 MHz is provided for the sake of an accuracy error of a magnetron which is a microwave oscillation apparatus.

The above microwave surface wave plasma has the characteristic that it has a high plasma density and a low electron temperature and makes it possible to subject the printed layer described above to sintering treatment at low temperature for short time, and a conductive layer comprising a high-density and smooth metal fine particle sintered film can be formed. A treatment surface is irradiated with a surface wave plasma having an even density in a plane. As a result thereof, an uneven film formed by proceeding of partial sintering of the particles in a plane is reduced as compared with in the cases of other sintering methods, and the particles can be prevented from growing, so that a very high-density and smooth film can be obtained. Also, since it is not necessary to provide an electrode in an in-plane treating chamber, contamination exerted by impurities originating in the electrode can be prevented, and a treatment material can be prevented from being damaged by abnormal discharge. Further, when a plastic base material is used, the above base material is less damaged.

Also, a microwave surface wave plasma is preferred for enhancing an adhesive property of the metal fine particle sintered film with the resin base material such as polyimide. The reason therefor is estimated to be attributable to that a microwave surface wave plasma is liable to generate a polar functional group such as a hydroxyl group, a carboxyl group and the like in an interface between the base material and the metal fine particle sintered film.

In the present invention, a microwave surface wave plasma is generated under an atmosphere of a reducing gas, preferably a hydrogen gas atmosphere. This allows an insulating oxide present on a surface of the metal fine particles to be reduced and removed, and a conductive layer having a good conductive performance is formed.

As described above, a microwave surface wave plasma is generated under an atmosphere of a reducing gas, and the printed layer described above is subjected to sintering treatment, whereby oxides present on a surface of the metal fine particles are reduced and removed. Accordingly, particles oxidized on a surface and particles oxidized up to an inside thereof can be used as the metal fine particles in the present invention.

The reducing gas forming the reducing atmosphere includes gases such as hydrogen, carbon monoxide, ammonia and the like and mixed gases thereof, and a hydrogen gas is particularly preferred in terms of less by-products.

If a mixture of inert gases such as nitrogen, helium, argon, neon, krypton, xenon and the like is used for the reducing gas, the effect that plasma is liable to be generated is provided.

As described above, the metal fine particle sintered film formed by subjecting to sintering treatment by a microwave surface wave plasma has a thickness of 50 nm to 2 μm, preferably 100 to 1000 nm.

The conductive substrate of the present invention is characterized by having a crystallite diameter of 25 nm or more measured by X ray diffraction. If the crystallite diameter is 25 nm or more, a high adhesive property of the base material with the metal fine particle sintered film is obtained. The crystallite diameter measured by X ray diffraction is preferably 28 nm or more from the viewpoint of obtaining the further high adhesive property. An upper limit value of the crystallite diameter shall not specifically be restricted, and it is usually about 100 nm.

In a method of X ray diffraction measurement, an X ray diffraction peak is obtained by means of a thin film X ray diffraction equipment. A crystallite diameter in a peak of a crystal face having the highest density is calculated from the obtained result using a Sherrer's equation ($D=k\lambda/\beta \cos \theta$, D: crystallite diameter (nm), k: constant, 0.9 is used in this case, $\lambda$: X ray wavelength (CuK$\alpha$ ray) 0.154 nm, $\beta$: peak half value width (rad)).

When the metal fine particle sintered film is copper, a peak area of a (111) face is preferably more than twice as large as a peak area of a (200) face in an X ray diffraction pattern obtained by the method described above. If a ratio of the above peak areas is twice or more, it is preferred in terms of an adhesive property thereof with the base material. From the viewpoint described above, the above ratio is more preferably 2.2 times or more.

In the conductive substrate of the present invention, it is characterized by that a void rate of a cross section of the metal fine particle sintered film is 1% or less. If the above void rate is 1% or less, an adhesive property of the base material with the metal fine particle sintered film is high. From the viewpoint described above, the above void rate is preferably 0.5% or less.

The above void rate is calculated from an area ratio of the void parts, wherein a cross section of the metal fine particle sintered film is observed under a scanning electron microscope, and the image obtained is subjected to image processing to classify black parts to voids. The void rate is calculated from the metal fine particle sintered film excluding the base material, and voids present in an interface between the base material and the metal fine particle sintered film are included in the metal fine particle sintered film.

Also, a carbon content of an inside of the metal fine particle sintered film which is measured by an X ray photoelectron spectroscopy is preferably less than 5%. If the above carbon content is less than 5%, it is advantageous in terms of a minuteness and a conductivity of the sintered film. From the viewpoint described above, the above carbon content is more preferably less than 1%.

In measuring the above carbon content, elemental analysis of carbon is carried out by means of an X ray photoelectron spectroscopic equipment while etching the metal fine particle sintered film. Etching is carried out up to an interface between the metal fine particle sintered film and the base material, and the carbon content is shown by a relative amount (%) of carbon based on the whole element amounts obtained.

The conductive substrate of the present invention comprises a conductive layer provided on a base material with a good adhesive property, suitably a pattern-shaped conductive layer, and it is a substrate which is excellent in a reliability and a conductivity. That is, the metal fine particle sintered film constituting the above conductive layer is adhered directly on the base material, and a heterogeneous metal layer or a metal oxide layer is not provided between the sintered film and the base material, so that the conductivity and the insulating property are not reduced. Further, since a surface of the base material is smooth, irregularities are not present in an interface between the metal fine particle sintered film and the base material, and the conductivity is not reduced.

Electronic components prepared by using the above conductive substrate of the present invention can effectively be used for printed wiring boards, multilayer printed wiring boards, flexible printed wiring boards and the like.

EXAMPLES

Next, the present invention shall be explained below in further detail with reference to examples, but the present invention shall by no means be restricted by the examples shown below.

Evaluating Methods:
1. Surface Resistance:

A surface resistance was measured by a four proving method by means of a surface resistance meter (Loresta GP, manufactured by Mitsubishi Chemical Analytech Co., Ltd.), and a volume resistivity was calculated from the film thickness.

2. Observation by Scanning Electron Microscope:

Observed at an accelerating voltage of 1 to 5 kV by means of a scanning electron microscope (SEM) S-4800 manufactured by Hitachi High-Technologies Corporation. The sample was cut by means of a microtome, and a cross section thereof was observed in optional five parts at a magnification of 100,000 times in a range of a width of 1 µm. An area ratio of the void parts based on the metal film was calculated by image processing, and an average value in the five parts was set as the void rate. Further, the presence of damages of the base material was observed from the SEM photographs, and a film thickness of the metal fine particle sintered film was measured.

3. Crystallite Diameter of the Metal Fine Particle Sintered film:

X ray diffraction measurement was carried out by means of a thin film X ray diffraction equipment (ATX-E, manufactured by Rigaku Corporation). A CuKα beam (wavelength λ: 0.154 nm) was used as the X ray source, and the measuring angle (2θ) was set to 20 to 100 degrees. The crystallite diameter was calculated from the obtained results based on a Sherrer's equation.

4. Elemental Analysis in the Metal Fine Particle Sintered Film:

Elemental analysis in an ion etching depth direction was carried out by means of an X ray photoelectron spectroscopic equipment (ESCA-3400, manufactured by Shimadzu Corporation). The etching conditions are shown below, and etching was carried out until metal elements were not detected. Gas used: argon, accelerating voltage: 0.1 kV, emission current: 30 mA A point in which an amount of the metal element component was 50% was set as an interface between the metal fine particle sintered film and the base material, and a relative amount of carbon atoms in an inside of the metal fine particle sintered film excluding parts each apart by 10% from the surface and the interface was determined (refer to FIG. 4).

5. Adhesive Property (Cross-Cut Peeling Test):

A surface of a metal fine particle sintered film side was cut vertically and horizontally in a cross-cut shape of 10 sections at an interval of 1 mm by means of a cutter, and an adhesive tape (Cellotape (trade name), manufactured by Nichiban Co., Ltd., width: 24 mm) was stuck thereon and then peeled off to evaluate the adhesive property by the degree of cross-cuts peeled. A method for showing the peeling state includes 100/100 showing a case in which 100 cross-cuts were not peeled off at all, 90/100 showing a case in which 90 cross-cuts remained and in which 10 cross-cuts were peeled off and 0/100 showing a case in which all of 100 cross-cuts were peeled off.

Example 1

A toluene dispersion (solid content: 30% by mass, manufactured by ULVAC, Inc.) of copper nanoparticles having an average primary particle diameter of 5 nm was coated on a polyimide film (Kapton 200H, manufactured by Du Pont-Toray Co., Ltd.) having a thickness of 75 µm by a spin coating method, and the coating film was dried naturally. Then, the substrate coated thereon with the copper fine particles was burned in advance at 300° C. for 30 minutes under the air in order to remove organic components.

Subsequently, the substrate was treated by a microwave surface wave plasma treating equipment (MSP-1500, manufactured by Micro Denshi Co., Ltd.). The plasma treatment was carried out at a hydrogen introducing pressure of 20 Pa, a hydrogen flow amount of 100 sccm and a microwave output of 1000 W using a hydrogen gas for 30 seconds since starting heating. The heating rate was set to about 400° C./minute, and the reached temperature was set to 230° C.

The copper nanoparticle sintered film thus obtained was evaluated by the methods described above, and the results thereof are shown in Table 1.

FIG. 1 is a scanning electron micrograph (hereinafter referred to as a SEM photograph 1) of a cross section of the conductive substrate 1 prepared in Example 1. As apparent from the above SEM photograph 1, it can be found that a thickness of the metal fine particle sintered film 2 in the conductive substrate 1 prepared in Example 1 is about 300 nm and that the base material 3 is not damaged. Further, the void rate calculated from the above SEM photograph 1 was 0.1% or less.

Figure 3:
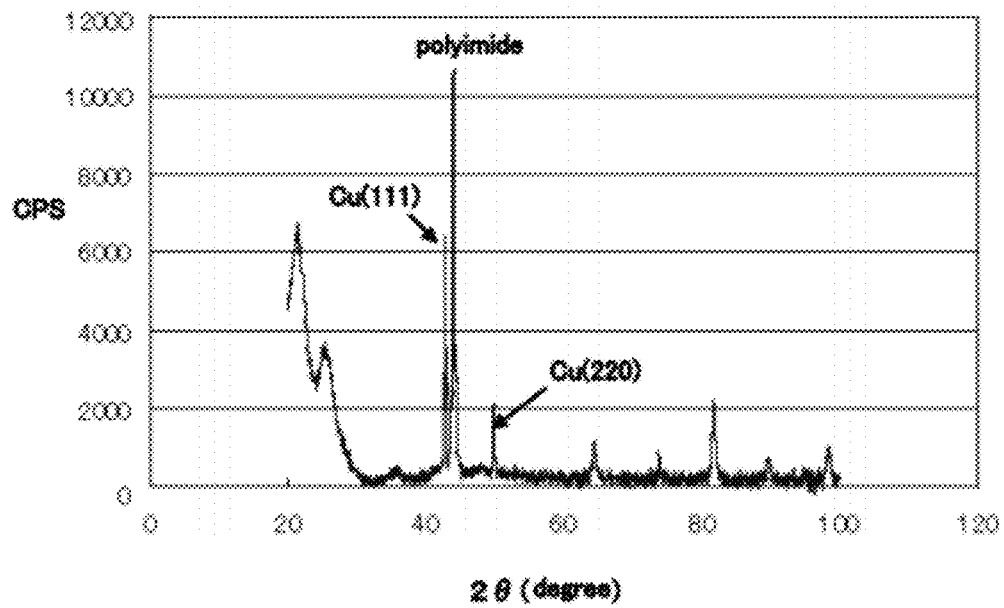
FIG. 3 is a result of X ray structural diffraction of the conductive substrate of the present invention according to Example 1.

Also, FIG. 3 shows a result of X ray structural diffraction of the conductive substrate prepared in Example 1, wherein the abscissa axis means a measuring angle (2θ), and the ordinate axis means an X ray detection intensity (cps). A crystallite diameter in the metal fine particle sintered film was calculated at 41.2 nm from the above results.

Figure 4:
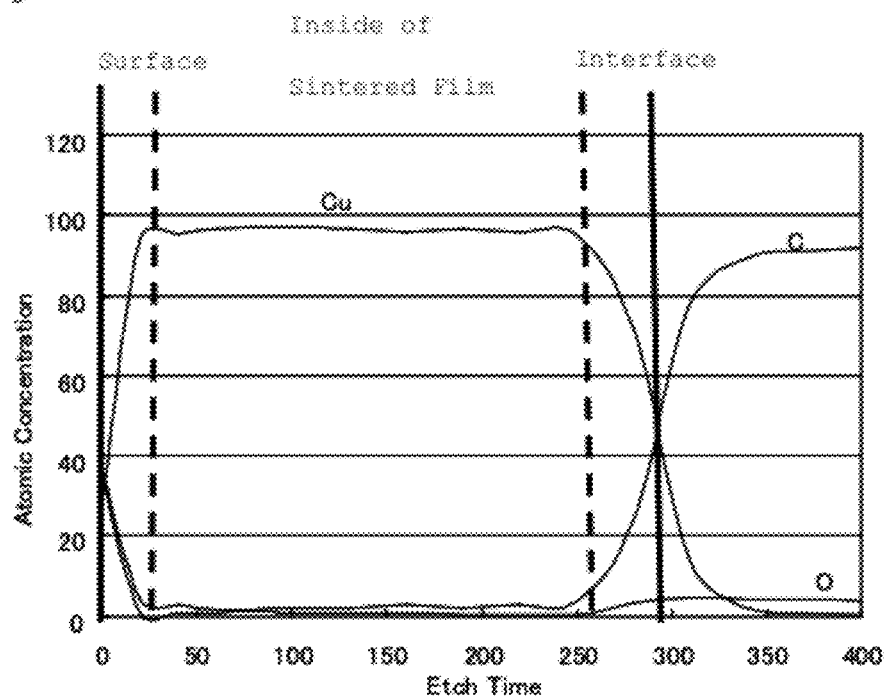
FIG. 4 is a result obtained by carrying out elemental analysis of the conductive substrate of the present invention according to Example 1 in an ion etching depth direction.

Next, FIG. 4 shows a result obtained by carrying out elemental analysis of the conductive substrate prepared in Example 1 in an ion etching depth direction. A carbon content was 0.5%.

Example 2

The same procedure as in Example 1 was carried out, except that the plasma treatment was carried out at a microwave output set to 800 W, a heating rate set to about 320° C./minute and a reached temperature set to 190° C. The copper nanoparticle sintered film thus obtained was evaluated in the same manner as in Example 1, and the results thereof are shown in Table 1.

Example 3

The same procedure as in Example 1 was carried out, except that the plasma treatment was carried out at a microwave output set to 600 W, a heating rate set to about 250° C./minute and a reached temperature set to 150° C. The copper nanoparticle sintered film thus obtained was evaluated in the same manner as in Example 1, and the results thereof are shown in Table 1.

Comparative Example 1

A copper nanoparticle sintered film was obtained in the same manner as in Example 1, except that in Example 1, sintering was carried out by means of a high frequency plasma equipment (ED-350, manufactured by Canon Anelva Engineering Corporation) in place of the sintering treatment carried out by the microwave surface wave plasma. In the specific method, sintering was carried out at a hydrogen introducing pressure set to 10 Pa, a hydrogen flow amount set to 100 sccm, an output set to 300 W, a heating rate set to about 100° C./minute and a reached temperature set to 120° C., and the treatment was carried out for 3 minutes after reaching 120° C. The copper nanoparticle sintered film thus obtained was evaluated in the same manner as in Example 1, and the results thereof are shown in Table 1.

Comparative Example 2

A copper nanoparticle sintered film was obtained in the same manner as in Example 1, except that in Example 1, sintering was carried out by means of an electric furnace (manufactured by NEMS Co., Ltd.) in place of the sintering treatment carried out by the microwave surface wave plasma.

In a specific method for sintering, the film was heated up to 300° C. at 10° C./minute under a reducing atmosphere of hydrogen 4% and argon 96% and then maintained for 30 minutes, and thereafter, it was cooled naturally.

Figure 2:
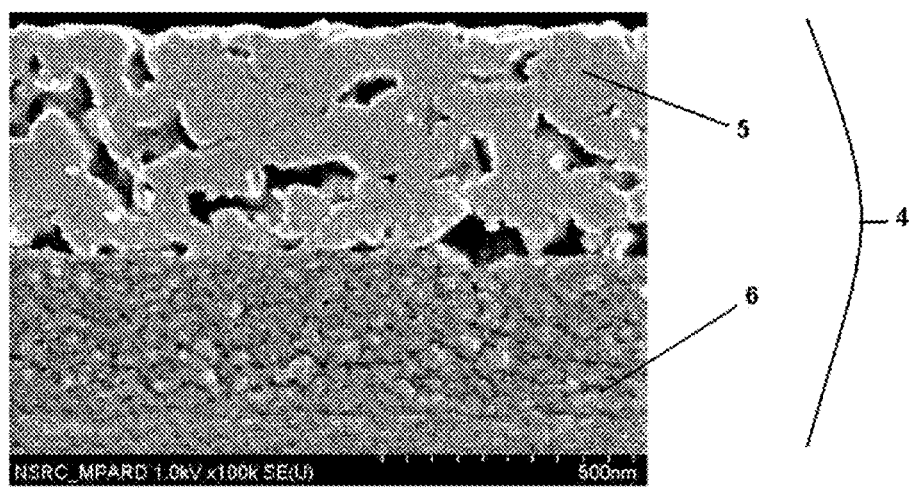
FIG. 2 is a scanning electron micrograph of a cross section of the conductive substrate according to Comparative Example 2.

The copper nanoparticle sintered film thus obtained was evaluated in the same manner as in Example 1, and the results thereof are shown in Table 1. Further, a scanning electron micrograph (hereinafter referred to as a SEM photograph 2) of a cross section thereof is shown in FIG. 2, and a result of X ray structural diffraction thereof is shown in FIG. 5.

Figure 5:
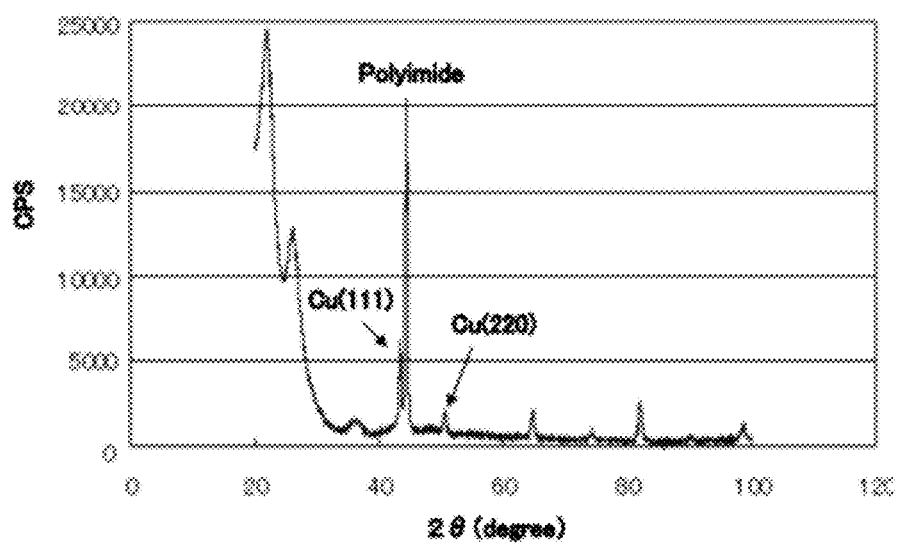
FIG. 5 is a result of X ray structural diffraction of the conductive substrate produced in Comparative Example 2.

A crystallite diameter in the metal fine particle sintered film was calculated at 23.9 nm from the result of FIG. 5.

Further, as apparent from the above SEM photograph 2, it can be found that a thickness of the metal fine particle sintered film 5 in the conductive substrate 4 prepared in Comparative Example 2 is about 500 nm and that the base material 6 is not damaged. However, as apparent from comparison with the SEM photograph 1, a lot of voids were observed, and the void rate calculated from the above SEM photograph 2 was 11.1%.

TABLE 1

|  | Example | | | Comparative Example | |
| --- | --- | --- | --- | --- | --- |
|  | 1 | 2 | 3 | 1 | 2 |
| Volume resistivity (Ω · cm) | $6.5 \times 10^{-6}$ | $7.0 \times 10^{-6}$ | $7.3 \times 10^{-6}$ | $7.8 \times 10^{-6}$ | $9.0 \times 10^{-6}$ |
| Damage of base material | none | none | none | none | none |
| Film thickness (nm) | 300 | 300 | 300 | 300 | 500 |
| Particle diameter of crystallite (nm) | 41.2 | 37.2 | 29.0 | 24.3 | 23.9 |
| Void rate (%) | 0.1% or less | 0.1% or less | 0.1% or less | 3% | 11.1% |
| Area ratio of (111) crystal face to (200) crystal face | 2.25:1 | 2.56:1 | 2.33:1 | 1.90:1 | 1.93:1 |
| Carbon content (%) | 0.5% | 0.8% | 1.0% | 5.0% | 20% or more |
| Adhesive property | 100/100 | 100/100 | 80/100 | 40/100 | 0/100 |

INDUSTRIAL APPLICABILITY

The conductive substrate of the present invention has a high adhesive property of a base material with a metal fine particle sintered film and is excellent a conductivity. Further, a circuit pattern can be formed directly on the base material by a printing method. Accordingly, the above conductive substrate can effectively be used for printed wiring boards, multilayer printed wiring boards, flexible printed wiring boards, electromagnetic wave shields and the like.

What is claimed is:

1. A conductive substrate prepared by printing a coating liquid containing metal or metal oxide fine particles on a base material to form a print layer and subjecting the above print layer to sintering treatment to form a metal fine particle sintered film, wherein a crystallite diameter in the metal fine particle sintered film which is measured by X ray diffraction is 25 nm or more, and in a cross section transecting the metal fine particle sintered film and base material the metal fine particle sintered film has a void rate of 1% or less.

2. The conductive substrate according to claim 1, wherein a carbon content of an inside of the metal fine particle sintered film which is measured by an X ray photoelectron spectroscopy is less than 5%.

3. The conductive substrate according to claim 1, wherein the metal or the metal oxide is at least one selected from copper, copper oxide and copper having an oxidized surface.

4. The conductive substrate according to claim 3, wherein the metal fine particle sintered film comprises a copper nanoparticle sintered film having a peak area of a (111) face that is more than twice as large as a peak area of a (200) face in an X ray diffraction pattern of the copper nanoparticle sintered film.

5. The conductive substrate according to claim 1, wherein a heterogeneous metal layer or a metal oxide layer is not provided between the metal fine particle sintered film and the base material.

6. The conductive substrate according to claim 1, wherein the base material is a polyimide resin.

7. The conductive substrate according to claim 1, wherein the sintering is carried out under an inert gas atmosphere or a reducing as atmosphere.

8. The conductive substrate according to claim 1, wherein the sintering is carried out by a surface wave plasma generated by applying a microwave energy.

9. A production process for a conductive substrate comprising a step of printing a coating liquid containing metal or metal oxide fine particles on a base material to form a print layer and a step of subjecting the above print layer to sintering treatment to form a metal fine particle sintered film, wherein a crystallite diameter in the metal fine particle sintered film which is measured by X ray diffraction is 25 nm or more, and in a cross section transecting the metal fine particle sintered film and base material the metal fine particle sintered film has a void rate of 1% or less.

10. The production process for a conductive substrate according to claim 9, wherein a carbon content of an inside of the metal fine particle sintered film which is measured by an X ray photoelectron spectroscopy is less than 5%.

11. The production process for a conductive substrate according to claim 9, wherein the metal or the metal oxide is at least one selected from copper, copper oxide and copper having an oxidized surface.

12. The production process for a conductive substrate according to claim 11, wherein the metal fine particle sintered film comprises a copper nanoparticle sintered film having a peak area of a (111) face that is more than twice as large as a peak area of a (200) face in an X ray diffraction pattern of the copper nanoparticle sintered film.

13. The production process for a conductive substrate according to claim 9, wherein a heterogeneous metal layer or a metal oxide layer is not provided between the metal fine particle sintered film and the base material.

14. The production process for a conductive substrate according to claim 9, wherein the base material is a polyimide resin.

15. The production process for a conductive substrate according to claim 9, wherein the sintering is carried out under an inert gas atmosphere or a reducing as atmosphere.

16. The production process for a conductive substrate according to claim 9, wherein the sintering is carried out by a surface wave plasma generated by applying a microwave energy.

17. The production process for a conductive substrate according to claim 16, wherein the sintering treatment is carried out at a heating rate of 100° C./minute or more.

18. The conductive substrate according to claim 1, wherein the metal fine particle sintered film forms a conductive layer.

19. The production process for a conductive substrate according to claim 9, wherein the metal fine particle sintered film forms a conductive layer.

20. A conductive substrate prepared by printing a coating liquid containing metal or metal oxide fine particles on a base material to form a print layer and subjecting the above print layer to sintering treatment to form a metal fine particle sintered film, wherein a crystallite diameter in the metal fine particle sintered film which is measured by X ray diffraction is 25 nm or more, and a cross section transecting the metal fine particle sintered film and base material the metal fine particle sintered film has a void rate of 1% or less, and wherein a heterogeneous metal layer or a metal oxide layer is not provided between the metal fine particle sintered film and the base material.

* * * * *